United States Patent
Pendharkar et al.

(10) Patent No.: US 8,148,228 B2
(45) Date of Patent: Apr. 3, 2012

(54) SURFACE PATTERNED TOPOGRAPHY FEATURE SUITABLE FOR PLANARIZATION

(75) Inventors: Sameer Pendharkar, Allen, TX (US); Binghua Hu, Plano, TX (US); Xinfen Celia Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 705 days.

(21) Appl. No.: 11/696,829

(22) Filed: Apr. 5, 2007

(65) Prior Publication Data

US 2008/0246117 A1    Oct. 9, 2008

(51) Int. Cl.
*H01L 21/8228* (2006.01)

(52) U.S. Cl. .. 438/325; 438/401; 438/692; 257/E21.304

(58) Field of Classification Search .......... 438/309–377, 438/401, 692–693, 325–326; 257/E21.304
See application file for complete search history.

(56) References Cited

U.S. PATENT DOCUMENTS

| | | | | |
|---|---|---|---|---|
| 4,573,257 A | * | 3/1986 | Hulseweh | 438/504 |
| 5,292,680 A | * | 3/1994 | Lur et al. | 438/144 |
| 5,397,734 A | * | 3/1995 | Iguchi et al. | 438/241 |
| 5,508,541 A | * | 4/1996 | Hieda et al. | 257/301 |
| 5,943,578 A | * | 8/1999 | Katakabe et al. | 438/359 |
| 6,146,957 A | * | 11/2000 | Yamasaki | 438/326 |
| 6,238,959 B1 | * | 5/2001 | Tung | 438/197 |
| 6,667,226 B2 | * | 12/2003 | Pinto et al. | 438/524 |
| 2007/0054471 A1 | * | 3/2007 | Chen et al. | 438/462 |
| 2007/0072397 A1 | * | 3/2007 | Yamauchi et al. | 438/478 |

OTHER PUBLICATIONS

Hu, et al., U.S. Appl. No. 11/068,117, entitled "A Method for Manufacturing a Semiconductor Device Having an Alignment Feature Formed Using an N-Type Dopant and a Wet Oxidation Process", filed Feb. 28, 2005.

* cited by examiner

*Primary Examiner* — H. Jey Tsai
(74) *Attorney, Agent, or Firm* — John J. Patti; Wade J. Brady, III; Frederick J. Telecky, Jr

(57) ABSTRACT

A method for manufacturing a semiconductor device that comprises implanting a first dopant type in a well region of a substrate to form implanted sub-regions that are separated by non-implanted areas of the well region. The method also comprises forming an oxide layer over the well region, such that an oxide-converted first thickness of the implanted sub-regions is greater than an oxide-converted second thickness of the non-implanted areas. The method further comprises removing the oxide layer to form a topography feature on the well region. The topography feature comprises a surface pattern of higher and lower portions. The higher portions correspond to locations of the non-implanted areas and the lower portions correspond to the implanted sub-regions.

10 Claims, 5 Drawing Sheets

SURFACE PATTERNED TOPOGRAPHY FEATURE SUITABLE FOR PLANARIZATION

TECHNICAL FIELD

The present invention is directed, in general, to a method for manufacturing a semiconductor device and, more specifically, to a method for manufacturing a semiconductor device having a topography feature that is suitable for planarization.

BACKGROUND

As integrated circuit (IC) features are becoming increasingly smaller, it is important for a photolithographic mask to be aligned precisely with the wafer to avoid misalignment between the layers of the IC. Most alignment schemes use alignment features formed by etching a topological marker into the wafer. The feature is used to diffract a laser alignment beam generated by a photolithography machine (e.g., a wafer stepper) during the masking process. The wafer stepper receives the diffraction pattern, and the relative position of the wafer and the photolithographic mask are thereafter adjusted accordingly so that the pattern of the photolithographic mask is precisely transferred to the wafer. Unfortunately, traditional alignment features can become problematic as the IC component sizes become smaller. E.g., there can be increasingly larger degrees of misalignment between the mask and wafer position as the component size decreases.

Accordingly, what is needed in the art is a method of manufacturing a semiconductor device having a topography feature, and the device formed therefrom, that does not experience the drawbacks of traditional alignment features.

SUMMARY

The disclosure provides a method for manufacturing a semiconductor device. The method comprises implanting a first dopant type in a well region of a substrate to form implanted sub-regions that are separated by non-implanted areas of the well region. The method also comprises forming an oxide layer over the well region, such that an oxide-converted first thickness of the implanted sub-regions is greater than an oxide-converted second thickness of the non-implanted areas. The method further comprises removing the oxide layer to form an topography feature on the well region. The topography feature comprises a surface pattern of higher and lower portions. The higher portions correspond to locations of the non-implanted areas and the lower portions correspond to the implanted sub-regions.

Another embodiment is a method of manufacturing an integrated circuit. One or more transistors are formed on or in a semiconductor substrate, wherein at least one of the transistors is manufactured by the above-described process. The first dopant type is an n-type dopant. Insulating layers are deposited on the transistors. Interconnects are formed through one or more of the insulating layers to interconnect the at least one transistor to another transistor of the integrated circuit.

Still another embodiment is an integrated circuit. The integrated circuit comprises one or more bipolar transistors on or in a semiconductor substrate. At least one of the bipolar transistors includes a well region having an topography feature thereon, topography feature including a surface pattern of higher portions and lower portions, and the well region being uniformly doped with an n-type dopant. The integrated circuit also comprises a second well region and n-doped buried layer. The second well region is adjacent to the well region, is doped with the n-type dopant, and includes a doped surface layer doped with a p-type dopant. The well region and second well region are on the n-doped buried layer.

DETAILED DESCRIPTION

The disclosure is based at least in part on the discovery of a process to fabricate a topography feature that is self-aligned with a component (e.g., a doped well region) within a semiconductor device. Other device components (e.g., other doped wells) are fabricated such that they are aligned with an alignment feature in a scribe region of the wafer substrate. Example processes to form such an alignment feature are described in U.S. patent application Ser. No. 11/068,117, by Hu et al. ("Hu") which is incorporated herein its entirety.

E.g., the alignment feature can be formed by oxidizing a portion of the well region and then stripping away the oxide to leave a uniform and unpatterned surface depression in the well region. In subsequent processing steps, the device substrate, including the depression in the well region, can be covered with a nitride layer and a second oxide layer. In such cases, it can be difficult to remove the oxide layer and underlying nitride layer from the depression. Failure to remove the oxide layer and underlying nitride layer can in turn reduce the yield of functional device in a number of ways: causing gate oxide integrity problems in adjacent transistors, difficulty in forming contacts to the well region, and mistuned photo processing due to e.g., changes in the expected reflectivity of the substrate's surface. As such, it is undesirable to use the uniform and unpatterned surface depression in the well region anywhere in a substrate (e.g., semiconductor wafer) that will be used to form end-products. However, for alignment purposes, it is still desirable to have uniform and unpatterned surface depression in the well region in non-product regions of the substrate (e.g., the scribe region).

The present disclosure describes the manufacture and use of a topography feature in end-product regions of the substrate. The topography feature comprises a patterned surface of higher and lower portions, thereby lessening the difficulty in removing the second oxide layer and nitride layer. One embodiment of the disclosure is a method of manufacturing a semiconductor device. FIGS. 1 to 8 present cross-section views of selected steps of an example implementation of a method of fabricating a semiconductor device 100 according to the principles of the present disclosure. In some embodiments, the device 100 is configured as an integrated circuit, and includes one or more transistors 102, such as a bipolar transistor. The method can include forming at least one of these transistors 102 in or on a semiconductor substrate 105 by the manufacturing processes disclosed herein.

Figure 1:
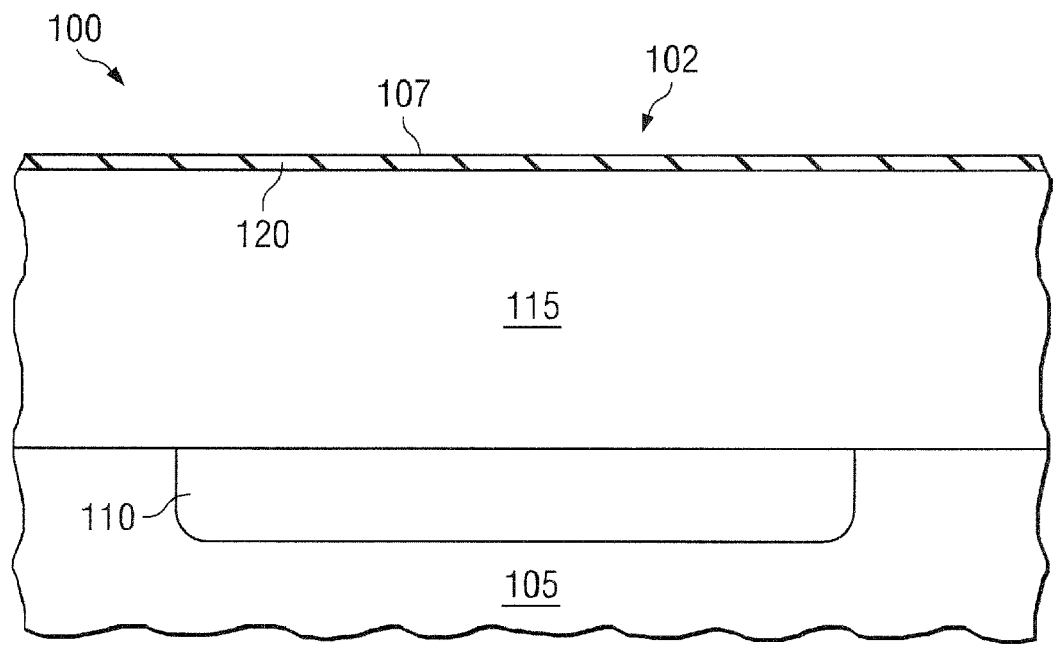
FIGS. 1 to 8 present cross-section views of selected steps in example implementation of a method of fabricating a semiconductor device according to the principles of the present disclosure.

FIG. 1 show the device 100 after including forming a doped buried layer 110 (e.g., an n-type dopant buried layer) in the substrate 105. E.g., as discussed in the context of FIG. 1-4 in Hu, a sacrificial oxide layer can be deposited on the substrate 105, and then patterned, followed by the implantation of p- or n-type dopants through openings in the patterned oxide layer into the substrate 105 (e.g., into a surface 107 of the substrate). The substrate 105 can include a wafer or a layer located on the wafer. E.g., the substrate 105 can include one or more doped epitaxial layers (e.g., p- or n-doped epitaxial silicon) on the silicon wafer. After stripping away the patterned oxide layer, the substrate 105 can be subjected to a diffusion process (e.g., a thermal diffusion process) to diffuse the dopants further into the substrate 105, and thereby form the doped buried layer 110. FIG. 1 also shows the device after depositing an epitaxial layer 115 (e.g., epitaxial silicon) on the substrate 105, and after depositing (e.g., thermally growing) a protective oxide layer 120 on the epitaxial layer 115, such as discussed in the context of FIG. 5 in Hu.

Figure 2:
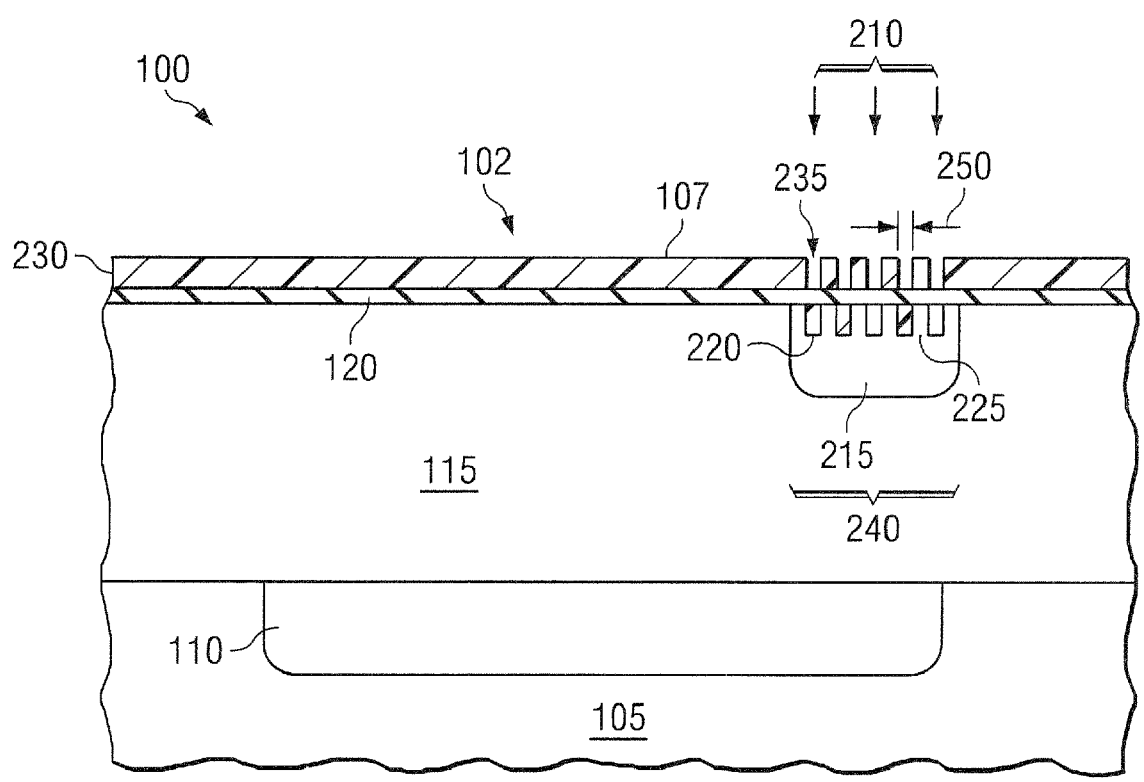

FIG. 2 shows the device 100 after implanting a first dopant type 210 (e.g., p- or n-type dopants) in a well region 215 of the substrate 105 (e.g., the epitaxial layer 115) to form implanted sub-regions 220 that are separated by non-implanted areas 225 of the well region 215. E.g., as discussed in the context of FIGS. 5-6 in Hu, a photoresist layer 230 can be deposited and patterned to provide an opening through which dopants are implanted. Unlike Hu, however, the photoresist layer 230 is patterned to provide a plurality of opening 235 over the well region 215. Consequently, the implanted sub-regions 220 and non-implanted areas 225 form an implanted dopant pattern 240 in the well region 215.

In some embodiments, a lateral dimension 250 (e.g., a dimension in the same plane as the substrate's surface 107) of each of the openings 235 is about 0.6 microns or less, and in some cases, from about 0.6 to 0.1 microns. E.g., in some cases, each of the implanted sub-regions 220 has a rectangular shape with at least one lateral dimension 250 being of about 0.6 microns or less. In some cases, each of the implanted sub-regions 220 has a square shape with lateral dimensions ranging from about 0.6 to 0.1 microns by about 0.6 to 0.1 microns. Limiting the lateral dimension 250 to about 0.6 microns helps to prevent an excessively large surface depression from being formed in the substrate 105 during a forthcoming oxidation step. The implanted dopant pattern 240 can comprise a regular pattern (e.g., a grid of rectangularly-shaped doped sub-regions separated by non-implanted areas) or an irregular pattern (e.g., a random or pseudo-random array of doped sub-regions separated by non-implanted areas).

In some cases, the implant dose of first dopant type 210 equals about 1E15 atoms/cm$^2$ or greater, in other cases about 1E16 atoms/cm$^2$ or greater. In some cases an implant energy of about 30 KeV or greater in used while in other cases the implant energy equals about 130 KeV or greater. Example first dopants 210 include n-type dopants such as P, As, Sb, or combinations thereof. Implanting P may impart less lattice damage to the substrate 105 (e.g., epitaxial layer 115) than implanting As or Sb. Other example first dopants 210 include p-type dopants such as B or In.

Figure 3:
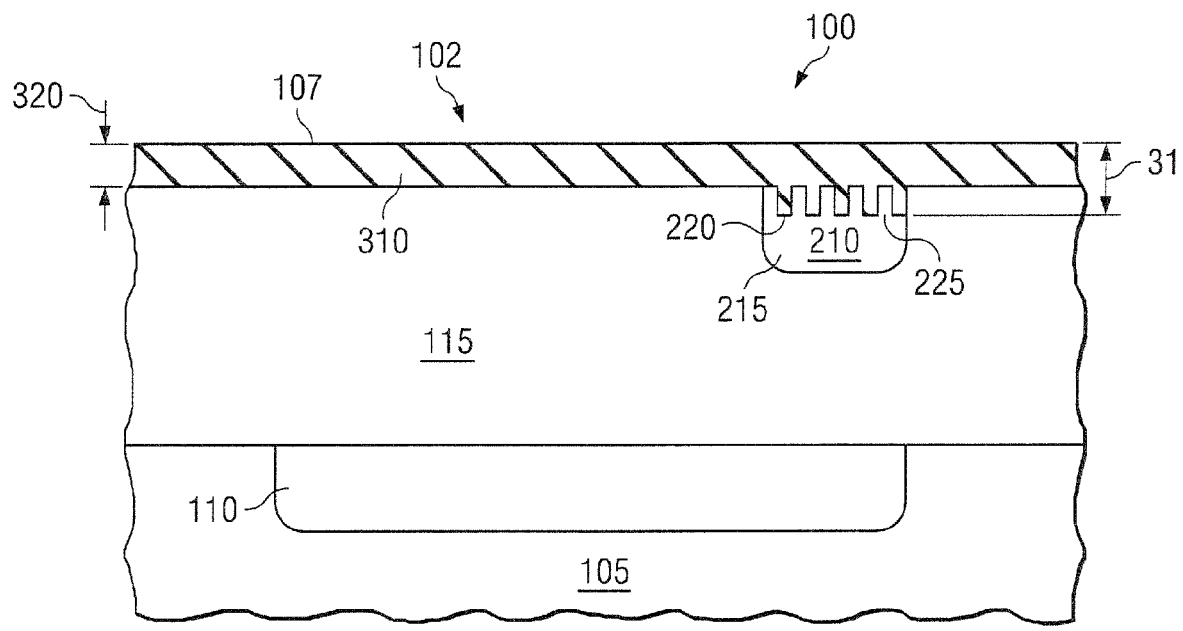

FIG. 3 shows the device 100 after forming an oxide layer 310 over the well region 215. In some embodiments, the process to form the oxide layer 310 includes atmospheric pressure chemical vapor deposition (CVD), although other conventional processes can be used. In some cases, the protective oxide layer 120 (FIG. 1) is stripped away and a new oxide layer is formed on the well region 215. In other cases, the oxide layer 310 is formed as a continuation of the protective oxide layer 120. E.g., the protective oxide layer 120 merges with the oxide layer 310. As illustrated in FIG. 3, the oxide layer 310 can be formed over the entire substrate 105.

The oxide layer 310 is formed such that an oxide-converted first thickness 315 of the implanted sub-regions 220 is greater than an oxide-converted second thickness 320 of the non-implanted areas 225. A silicon substrate having implanted dopants (e.g., n-type dopants) oxidizes at a faster rate than the same substrate with no implanted dopants (see e.g., discussion in the context of FIG. 7 in Hu). Consequently, an implanted sub-region 220 of the well region 215 oxidizes at a faster rate than a non-implanted area 225 of the well region 215. In some cases, the rate of oxidation of the implanted sub-region 220 ranges from about 2 to 3 times faster than the rate of oxidation of the non-implanted area 225. In some embodiments, a ratio of the first oxide-converted thickness 315 to the second oxide-converted thickness 320 ranges from about 1.5:1 to 3:1. E.g., the first oxide-converted thickness 315 can equal about 150 nm and the second oxide-converted thickness 320 can equal about 100 nm.

Figure 4:
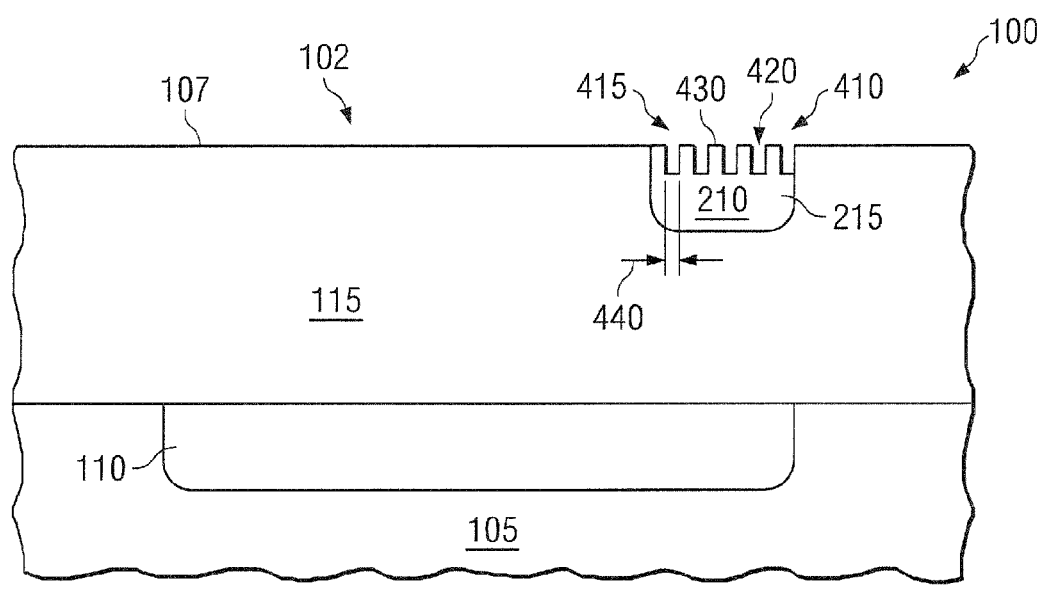

FIG. 4 shows the device 100 after removing the oxide layer 310 (FIG. 3) to form a topography feature 410 on the well region 215. E.g., in some cases, removing the oxide layer 310 includes exposing the oxide layer to hydrofluoric acid. The topography feature 410 comprises a surface pattern 415 of higher portions 420 and lower portions 430 of the well region 215.

The higher portions 420 correspond to locations of the non-implanted areas 225 and the lower portions 430 correspond to the implanted sub-regions 220 (FIG. 2). Because the non-implanted areas 225 are oxidized at a slower rate than the implanted sub-regions 220, less of the thickness 320 of well region 215 above the non-implanted areas 225 is removed as compared to the thickness 315 removed above the implanted sub-regions 220 (FIG. 3). As a result, the non-implanted areas 225 emerge as higher portions 420 of the well region and the implanted sub-regions 220 emerge as lower portions 430. E.g., in some embodiments, the higher portions 420 are at least about 50 nm above the lower portions 430.

As illustrated in FIG. 4, when the entire substrate surface 107, is covered with the oxide layer 310 (and oxidized at about the same rate as the non-implanted areas 225), and then removed, the higher portions 420 of the surface pattern 415 is coplanar with the substrate surface 107 and the lower portions 430 are below the surface 107.

The location, size and shape of the higher and lower portions 420, 430 of the surface pattern 415 closely correspond, respectively, to the non-implanted areas 225 and implanted sub-regions 220 of the implanted dopant pattern 240. E.g., in some cases, the surface pattern 415 can form a grid of rectangularly-shaped doped sub-regions 220 that are lower portions 430 in the well region 215. In some cases, each of the rectangularly-shaped doped sub-regions 220 are lower portions 430 that have a lateral dimension 440 of no more than about 0.6 microns. In some cases, each of the lower portions 430 has a square shape with lateral dimensions of about 0.6 to 0.1 microns by 0.6 to 0.1 microns.

Figure 5:
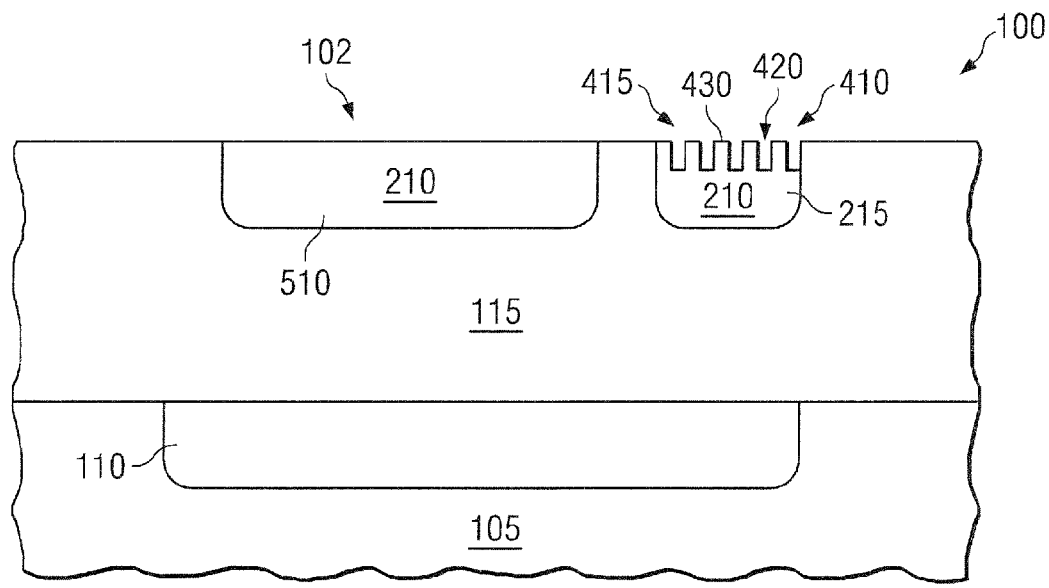

One skilled in the art would appreciate that there could be multiple additional steps to complete the fabrication of the device. E.g., FIG. 5 shows the device 100 after implanting dopants into the substrate 105 (e.g., epitaxial layer 115) to form a second well region 510 such that the second well region 510 is formed adjacent to the well region 215. Example conditions and procedures to pattern and implant dopants to form the second well region 510 are discussed in the context of FIGS. 9-10 in Hu.

In some cases, the second well region 510 is implanted with dopants of the same dopant type as the first dopant type 210 that was implanted into the well region 215. E.g., both the second well region 510 and well region 215 can be implanted with first dopant type 210 of n-type dopants. In some cases, the amount of dopants implanted into the well region 215 is greater than the amount of dopants implanted into the second well region (e.g., the well region is n++, while the second well region is n−)

Figure 6:
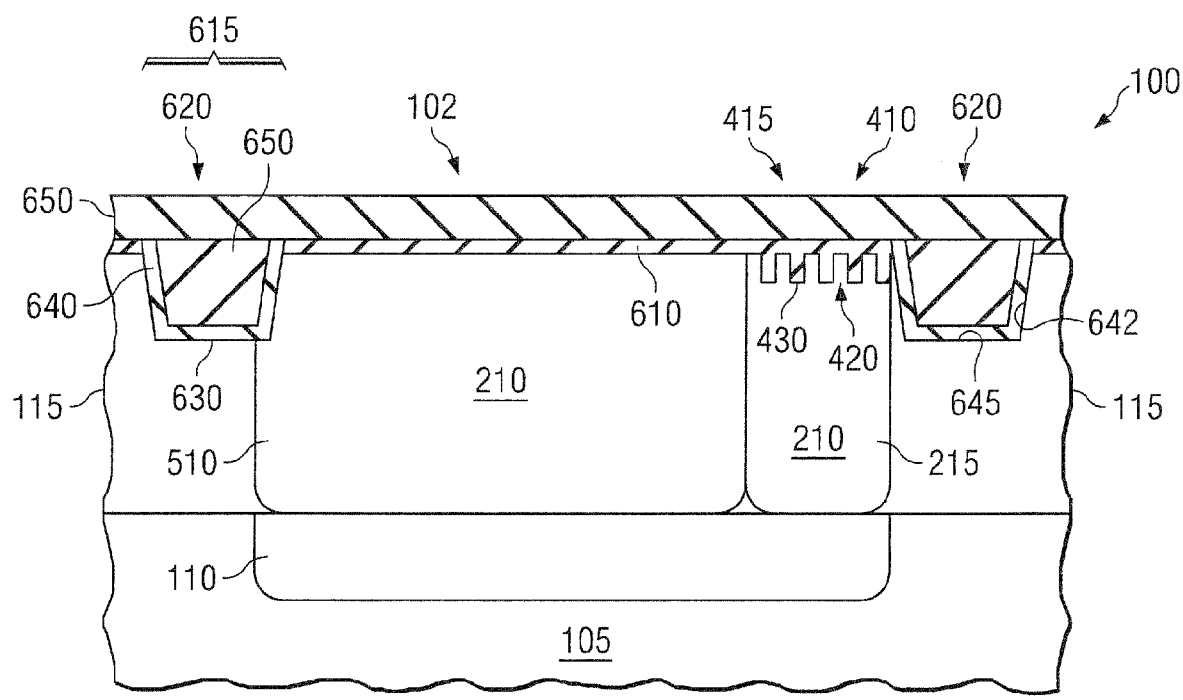

FIG. 6 shows the device 100, after performing a thermal process to diffuse the first dopants 210 throughout the well region 215. An example thermal process includes heating to a temperature of about 900° C. or greater for about 60 minutes or longer. The thermal process is configured to cause the dopants 210 to diffuse homogenously throughout the well region 215. In some cases, after the thermal process, a concentration of the first dopants 210 in the implanted sub-regions 220 are substantially equal to a concentration of the first dopants 210 in the non-implanted areas 225 (FIG. 2). In some embodiments, the concentration difference in first dopants 210 is less than about 20 percent E.g., after the thermal treatment, the concentration of first dopants 210 in the implanted sub-regions 220 equals about 1E19 atoms/cm$^2$ and the concentration of first dopants 210 in the non-implanted area 225 equals about 0.8E19 atoms/cm$^2$ (e.g., a difference of about 0.2E19 atoms/cm$^2$).

As further illustrated in FIG. 6, the thermal process can also diffuse dopants in the second well region 510. In some embodiments, thermal process causes the second well region 510 and the well region 215 to be extended deep into the substrate 105 (e.g., through the epitaxial layer 115) such that they are on the doped buried layer 110. In cases where the well region 215, second well region 510 and doped buried layer 110 are all doped with n-type dopants, these structures are referred to as deep-n (DEEPN), deep n-well (DNWELL), and n-buried layer (NBL), respectively.

FIG. 6 also shows the device 100 after blanket depositing a nitride layer 610 (e.g., silicon nitride) over the substrate 105 and then patterning the nitride layer 610 to expose portions 615 of the substrate 105 where isolation structures 620 (e.g., shallow trench isolation structures) are formed in the substrate 105. Forming the isolation structures 620 includes forming openings 630 (using a conventional silicon etch) in the exposed portions 615 of the substrate 105 (e.g., the epitaxial layer 115), forming a conformal thermal oxide liner 640 on walls 642 and a base 645 of the openings 630 and depositing an oxide layer 650 (e.g., silicon oxide) in the openings 630 and on the substrate 105. Example conditions and procedures to form isolation structures are further discussed in the context of FIG. 12 in Hu.

Figure 7:
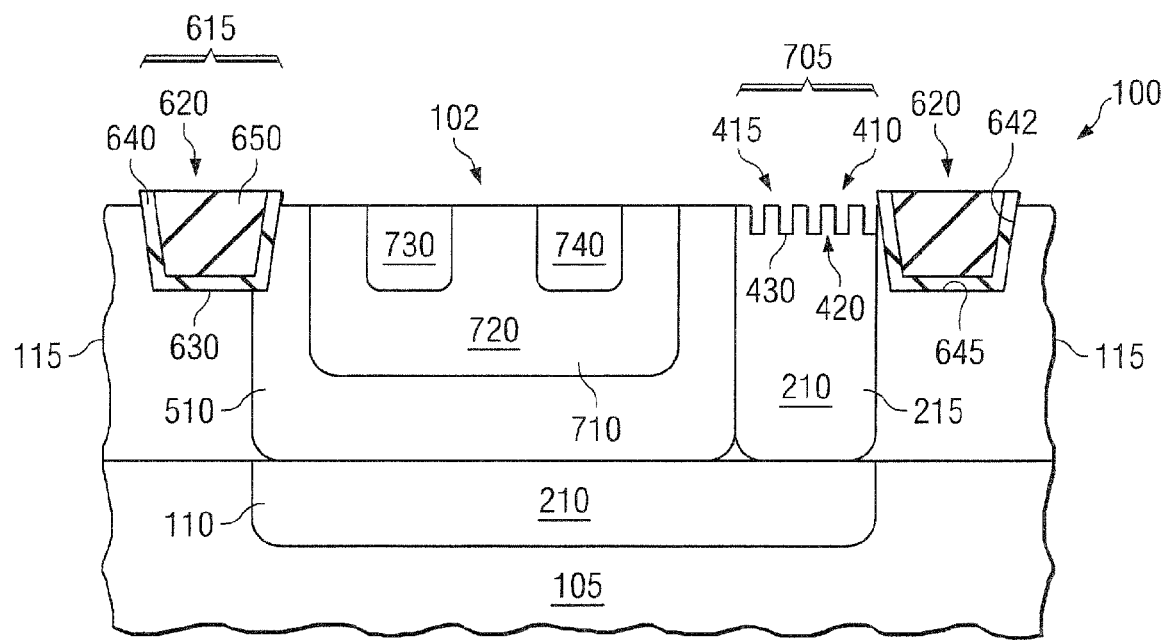

As illustrated in FIG. 7, forming the isolation structure 620 further includes planarizing the substrate 105 to remove the oxide layer 650 (FIG. 6) from the substrate 105. including that portion 705 of the oxide layer 650 that is located over the surface pattern 415. E.g., chemical mechanical polishing (CMP) can be used to planarize the substrate 105 with the nitride layer 610 (FIG. 6) used as a CMP stop layer. After planarizing the substrate 105, the nitride layer 610 can be removed by a nitride stripping process (e.g., hot phosphoric acid wash). The surface pattern 415 of the well region 215 facilitates the nitride stripping process's complete removal of the nitride layer 610 from over the well region 215.

FIG. 7 also shows the device 100 after performing additional patterning, implantation and annealing steps to form additional doped structures in the substrate 105. The formation of these structures in their desired locations relative to each other and the well region 215 can be facilitated by the used of the surface pattern 415 as an topography feature 410. E.g., similar procedures to that discussed in the context of FIGS. 5-6 can be done to form a doped surface layer 710 within the second well region 510, wherein the doped surface layer 710 is doped with a second dopant type 720 that is opposite to the first dopant type 210 (e.g., the second dopant type 720 is a p-type dopant when the first dopant type 210 is an n-type dopant).

Analogous steps can also be performed to form an emitter layer 730 and a base layer 740 in the doped surface layer 710. In some cases, the emitter layer is doped with the same dopant type as the first dopant type 210, and the base layer 740 is doped with the same dopant type as the second dopant type 720. In some cases, the amount of the first dopant type 210 in the emitter layer 730 is greater than the amount of first dopant type 210 in the second well region 510. E.g., the second well region 510 can be n– while the emitter layer 730 is n+. In some cases, the amount of second dopant type in the base layer 740 is greater than the amount of dopant in the doped surface layer 710. E.g., the doped surface layer 710 can be p– while the base layer 740 is p+. The arrangement of these structures 710, 730, 740 and their relative dopant concentrations facilitates the fabrication of the transistor 102 configured as a bipolar transistor.

Figure 8:
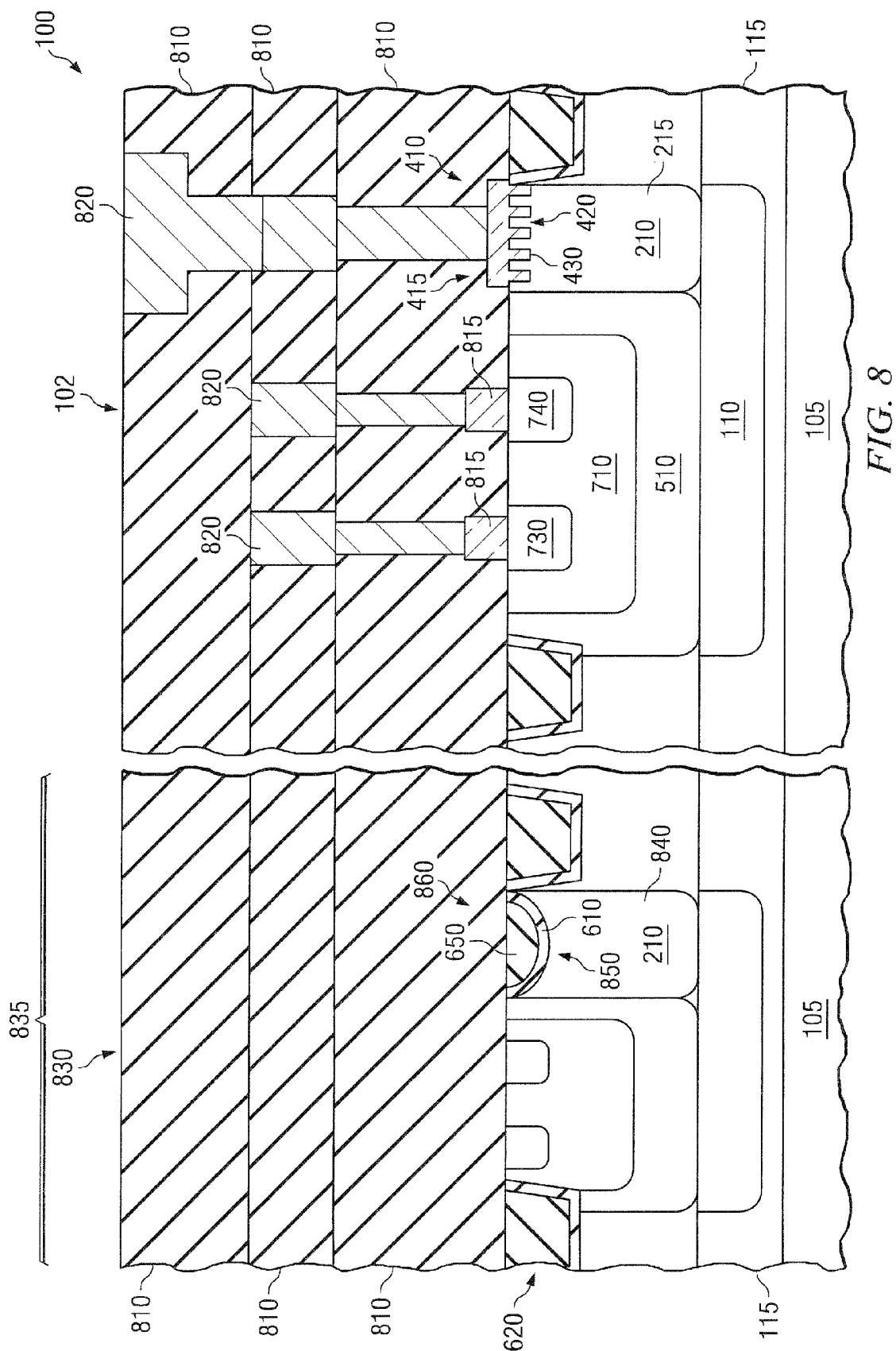

FIG. 8 shows the device 100 after depositing insulating layers 810 (e.g., a pre-metal dielectric layer and inter-level dielectric layers) on the transistor 102. FIG. 8 also shows the device 100 after forming metal-silicide contacts 815 and interconnects 820 (e.g., contacts, lines, single or dual damascene interconnect structures, or other conventional interconnect structures) through one or more of the insulating layers 810 to interconnect the transistor 102 to another transistor, e.g., similarly formed transistors or to other transistors 830 (e.g., bipolar or MOS transistors) of the device 100.

FIG. 8 also illustrates another embodiment, the device 100 configured as an integrated circuit. The device 100 can comprise any of the above-discussed embodiments of components structures. The device 100 comprises one or more bipolar transistors 102 on or in a semiconductor substrate 105. At least one of the bipolar transistors 102 includes a well region 215 (e.g., DEEPN) having a topography feature 410 thereon. The topography feature 410 includes a surface pattern 415 of higher portions 420 and lower portions 430. The well region 215 is uniformly doped with a dopant type 210 (e.g., n-type dopant). The device 100 further includes a second well region 510 (e.g., NWELL) adjacent to the well region 215. The second well region 510 is doped with the same dopant type 210 as the well region 215 (e.g., n-type dopant). The second well region includes a doped surface layer 710 that is doped with a second dopant types (e.g., a p-type dopant). The device also includes a doped buried layer 110 (e.g., NBL). The well region 215 and second well region 510 are on the doped buried layer 110.

In some cases, the doped surface layer 710 further includes an emitter layer 730 (e.g., n-doped) and a base layer 740 (e.g., p-doped). In such embodiments, the well region 215 can be configured as a collector.

Some embodiments the device 100 configured as an integrated circuit, prior to dicing, can include a dummy transistor structure 830 located in the scribe region 835 of the substrate 105. The dummy transistor structure 830 is a sacrificial structure formed in the scribe region 835 of the substrate 105. The dummy transistor 830 is formed in order to use its alignment feature to facilitate the formation of active components of the device 100.

The dummy transistor 830 includes a third well region 840. The well region 840 can be formed in substantially the same fashion as the well region 215 of the transistor 102. E.g., the third well region 840 can be doped with the first dopant type 210 (n-type dopant) in the same fashion and at the same time the well region 215 is being formed elsewhere on the substrate 105. The third well region 840 has an alignment feature 850. Unlike the topography feature 410 of the transistor 102, however, the alignment feature 850 has a uniform and unpatterned surface depression 860 in the substrate 105. The alignment feature 850 may still include the nitride layer 610 and oxide layer 650 that were removed from the transistor 102 (FIG. 6). That is, the planarization process and nitride stripping process discussed above in the context of FIG. 7 may not remove the nitride layer 610 and oxide layer 650 from the surface depression 860. In some cases, the dummy transistor structure 830 only has the third well region 840 and alignment feature 850. In other cases the dummy transistor structure 830 may include other component structures analogous to that manufactured in the transistor 102.

Those skilled in the art to which the disclosure relates will appreciate that other and further additions, deletions, substitutions and modifications may be made to the described example embodiments, without departing from the invention.

What is claimed is:

1. A method comprising:
    forming a first well region in a substrate;
    forming a second well region in a substrate;
    forming a buried layer in a substrate underneath at least a portion of the first and second well regions;
    forming a plurality of recesses in the second well region of the substrate, wherein the recesses are arranged in a pattern;
    forming a nitride layer over at least a portion of the substrate so as to substantially cover the first and second well regions, wherein the step of forming the nitride layer occurs after the step of forming the plurality of recesses;
    forming an oxide layer over the nitride layer;
    polishing the substrate with a chemical-mechanical polishing (CMP) process, wherein the nitride layer operates at least in part as a CMP stop layer; and
    removing the nitride layer after the polishing step.

2. The method of claim 1, wherein the step of removing further comprises applying a hot phosphoric acid wash to the substrate.

3. The method of claim 2, wherein each well region is about 0.6 μm by about 0.6 μm.

4. The method of claim 3, wherein the step of forming the oxide layer further comprises forming the oxide layer over the nitride layer with an atmospheric pressure chemical vapor deposition (APCVD) process.

5. The method of claim 4, wherein the pattern is a regular rectangular pattern.

6. A method comprising:
    forming a first well region in a substrate;
    forming a second well region in a substrate that is substantially adjacent to the first well region;
    forming a buried layer in a substrate underneath the first and second well regions;
    forming a plurality of recesses in the second well region of the substrate, wherein the recesses are arranged in a pattern;
    forming a nitride layer over at least a portion of the substrate so as to substantially cover the first and second well regions the step of forming the nitride layer occurs after the step of forming the plurality of recesses;
    forming an oxide layer over the nitride layer;
    polishing the substrate with a CMP process, wherein the nitride layer operates at least in part as a CMP stop layer;
    removing the nitride layer after the polishing step;
    forming a surface doped region in the first well region of the substrate;
    forming an emitter region in the surface doped region; and
    forming a base region in the surface doped region.

7. The method of claim 6, wherein the step of removing further comprises applying a hot phosphoric acid wash to the substrate.

8. The method of claim 7, wherein each well region is about 0.6 μm by about 0.6 μm.

9. The method of claim 8, wherein the step of forming the oxide layer further comprises forming the oxide layer over the nitride layer with an atmospheric pressure chemical vapor deposition (APCVD) process.

10. The method of claim 9, wherein the pattern is a regular rectangular pattern.

* * * * *